United States Patent
Jung et al.

(10) Patent No.: US 9,349,907 B2
(45) Date of Patent: May 24, 2016

(54) METHOD OF MANUFACTURING METAL OXIDE CRYSTAL AND METHOD OF FABRICATING SUBSTRATE FOR SOLAR CELL

(71) Applicant: ELECTRONICS AND TELECOMMUNICATIONS RESEARCH INSTITUTE, Daejeon (KR)

(72) Inventors: Mi Hee Jung, Daejeon (KR); Moo Jung Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 50 days.

(21) Appl. No.: 14/211,791

(22) Filed: Mar. 14, 2014

(65) Prior Publication Data

US 2015/0044815 A1    Feb. 12, 2015

(30) Foreign Application Priority Data

Aug. 9, 2013    (KR) .................... 10-2013-0094908

(51) Int. Cl.
  *H01L 31/18*     (2006.01)
  *C30B 7/14*      (2006.01)
  *C30B 29/16*     (2006.01)

(52) U.S. Cl.
  CPC .............. *H01L 31/1884* (2013.01); *C30B 7/14* (2013.01); *C30B 29/16* (2013.01)

(58) Field of Classification Search
  None
  See application file for complete search history.

(56) References Cited

U.S. PATENT DOCUMENTS

| | | | |
|---|---|---|---|
| 5,972,527 A * | 10/1999 | Kaijou et al. | 428/697 |
| 2003/0145779 A1* | 8/2003 | Alivisatos et al. | 117/2 |
| 2011/0220887 A1* | 9/2011 | Wang et al. | 257/43 |
| 2012/0135597 A1* | 5/2012 | Jung et al. | 438/608 |

FOREIGN PATENT DOCUMENTS

| | | |
|---|---|---|
| KR | 10-1010071 B1 | 1/2011 |
| KR | 10-2011-0069198 | 6/2011 |

OTHER PUBLICATIONS

Eun Sik Kwak, et al., "Compact Inverse-Opal Electrode Using Non-Aggregated TiO2 Nanoparticles for Dye-Sensitized Solar Cells", Advanced Functional Materials, vol. 19, pp. 1093-1099, Feb. 25, 2009.
Tammy P. Chou, et al., "Hierarchically Structured ZnO Film for Dye-Sensitized Solar Cells with Enhanced Energy Conversion Efficiency", Advanced Materials, vol. 19, pp. 2588-2592, Aug. 9, 2007.
Qifeng Zhang, et al., "Polydisperse Aggregates of ZnO Nanocrystallites: A Method for Energy-Conversion-Efficiency Enhancement in Dye-Sensitized Solar Cells**", Advanced Functional Materials, vol. 18, pp. 1654-1660, May 20, 2008.
Qifeng Zhang, et al., "Aggregation of ZnO Nanocrystallites for High Conversion Efficiency in Dye-Sensitized Solar Cells**", Angewandte chemie, vol. 47, pp. 2402-2406, Feb. 19, 2008.

* cited by examiner

*Primary Examiner* — Stanetta Isaac
(74) *Attorney, Agent, or Firm* — Rabin & Berdo, P.C.

(57) ABSTRACT

Provided are a method of manufacturing a metal oxide and a substrate for a solar cell. The method of manufacturing the metal oxide according to the inventive concept includes mixing a metal precursor material, a basic material, amphiphilic molecules and distilled water to prepare a metal precursor solution, performing a first heat treatment with the metal precursor solution to form a metal oxide, and performing a second heat treatment with the metal oxide to form a pair of metal oxide disks having a single crystalline structure. A pair of zinc oxide disks includes a first disk, and a second disk separated from the first disk in a perpendicular direction to the first disk.

15 Claims, 4 Drawing Sheets

METHOD OF MANUFACTURING METAL OXIDE CRYSTAL AND METHOD OF FABRICATING SUBSTRATE FOR SOLAR CELL

CROSS-REFERENCE TO RELATED APPLICATIONS

This U.S. non-provisional patent application claims priority under 35 U.S.C. §119 of Korean Patent Application No. 10-2013-0094908, filed on Aug. 9, 2013, the entire contents of which are hereby incorporated by reference.

BACKGROUND OF THE INVENTION

The present invention disclosure herein relates to a metal oxide, and more particularly, to a method of manufacturing metal oxide used in a solar cell.

As fossil energy is exhausted, researches on alternative energy are actively conducted. Particularly, researches on alternative energy using inexhaustible natural phenomenon such as the sunlight, the wind, etc. are in the limelight.

A solar cell generates electric energy by using light energy emitted from the sun. The solar cell may be classified into a solar cell composed of an inorganic material such as silicon or a semiconductor compound, and a dye-sensitized solar cell in which dye is adsorbed on the surface of nano-crystalline oxide particles. The solar cell receives attention as an inexhaustible energy source and an environment friendly energy source.

SUMMARY OF THE INVENTION

The present disclosure provides a single crystalline metal oxide manufactured through a low temperature solution process.

The present disclosure also provides a method of manufacturing a single crystalline metal oxide for a solar cell on a mass production basis.

The tasks to be solved by the present inventive concept is not limited to the above-described tasks, however other tasks not mentioned will be precisely understood from the following description by a person skilled in the art.

Embodiments of the inventive concept provide methods of manufacturing a metal oxide crystal including mixing a metal precursor material, a basic material, amphiphilic molecules and distilled water to prepare a metal precursor solution, performing a first heat treatment with the metal precursor solution to form a metal oxide, and performing a second heat treatment with the metal oxide to form a pair of metal oxide disks having a single crystalline structure. A pair of zinc oxide disks includes a first disk, and a second disk separated from the first disk in a perpendicular direction to the first disk.

In some embodiments, the metal precursor solution may include metal ion complexes and amphiphilic molecules disposed between the metal ion complexes and having a lamella structure.

In other embodiments, the amphiphilic molecules of the lamella structure may include outer layers and inner layers disposed between the outer layers, and the metal complex ions may be disposed on the outer layers.

In still other embodiments, the outer layers may exhibit anionic charge, and the metal complex ions may be cations.

In even other embodiments, hydrophilic functional groups of the amphiphilic molecules may form the outer layers, and hydrophobic functional groups of the amphiphilic molecules may form the inner layers.

In yet other embodiments, the metal oxide may include zinc oxide, the forming of the metal oxide may include forming zinc oxide having a hexagonal system, and single crystalline zinc oxide may have the hexagonal system.

In further embodiments, the amphiphilic molecule may be represented by following Formula 1.

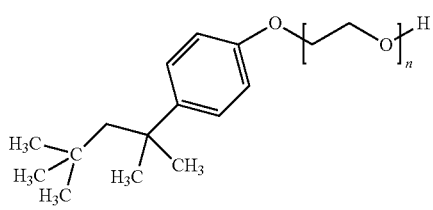

[Formula 1]

Wherein, n is an integer of 5 to 15.

In still further embodiments, the metal precursor solution may include zinc nitrate hexadrate, and the basic material may include hexamethylenetetramine.

In even further embodiments, the second heat treatment may be performed at from about 350° C. to about 500° C.

In other embodiments of the inventive concept, methods of fabricating an electrode for a solar cell include providing a preparation solution including a zinc precursor, a basic material and distilled water, adding amphiphilic molecules into the preparation solution to prepare a zinc precursor solution, performing heat treatment with the zinc precursor solution to form zinc oxide having a hexagonal system, sintering the zinc oxide to form a pair of single crystalline zinc oxide disks, and growing the pair of single crystalline zinc oxide disks to form a zinc oxide crystal film. The pair of single crystalline zinc oxide disks includes a first disk and a second disk separated from the first disk in a perpendicular direction to the first disk.

In some embodiments, the zinc precursor solution may include zinc complex cations, and amphiphilic molecules disposed between the zinc complex cations. The amphiphilic molecules may have a lamella structure.

In other embodiments, the lamella structure may include outer layers including hydrophilic functional groups of the amphiphilic molecules, and inner layers disposed between the outer layers and including hydrophobic functional groups of the amphiphilic molecules.

In still other embodiments, the amphiphilic molecules may include polyethylene glycol tert-octylphenyl ether.

In even other embodiments, the second disk may have a size and a shape same as or similar to those of the first disk, and the second disk may be overlapped with the first disk from a planar view.

In yet other embodiments, the metal precursor solution may include zinc nitrate hexadrate, and the basic material may include hexamethylenetetramine.

The metal oxide of the inventive concept may be manufactured by using amphiphilic molecules. Accordingly, the metal oxide may have a hexagonal single crystalline structure. The size and the shape of the metal oxide may be controlled by controlling the kind, the concentration and/or the amount of the amphiphilic molecules used.

According to the inventive concept, the crystalline metal oxide may be manufactured as a solution state at a temperature condition lower than a vapor deposition method. Therefore, a film including the single crystalline metal oxide may be easily produced in a large area. The single crystalline metal oxide film may be used as an electrode of a solar cell. A solar cell including the metal oxide of the inventive concept may show high photoconductivity and stability.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

Example embodiments of the inventive concept will be described below in more detail for sufficient understanding of the constitution and the effect of the inventive concept with reference to the accompanying drawings. The inventive concept may, however, be embodied in different forms and should not be construed as limited to the embodiments set forth herein. Rather, these embodiments are provided so that this description will be thorough and complete, and will fully convey the scope of the present inventive concept to those skilled in the art.

The terminology used herein is for the purpose of describing particular example embodiments only and is not intended to be limiting of the present inventive concept. As used herein, the singular forms are intended to include the plural forms as well, unless the context clearly indicates otherwise. It will be further understood that the terms "comprises" and/or "comprising," when used in this specification, specify the presence of stated features, steps, operations, and/or devices, but do not preclude the presence or addition of one or more other features, steps, operations, and/or devices thereof.

It will also be understood that when a layer (or film) is referred to as being 'on' another layer (or film) or substrate, it can be directly on the other layer (or film) or substrate, or intervening layers (or films) may also be present.

It will be understood that, although the terms first, second, third etc. may be used herein to describe various regions, layers (or films), etc. these regions and layers should not be limited by these terms. These terms are only used to distinguish one region or layer (or film) from another region or layer (film). Thus, a first layer discussed below could be termed a second layer. Example embodiments embodied and described herein may include complementary example embodiments thereof. Unless otherwise defined, all terms (including technical and scientific terms) used herein have the same meaning as commonly understood by one of ordinary skill in the art to which this inventive concept belongs.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

Figure 1:
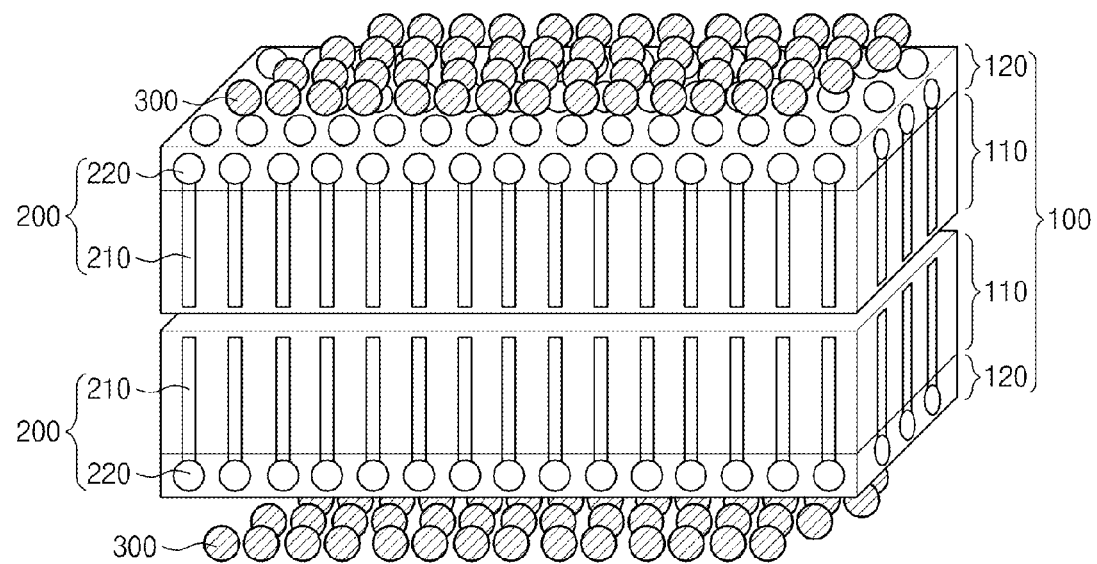
FIGS. 1 to 3 are mimetic diagrams illustrating the manufacturing process of a metal oxide according to an embodiment of the inventive concept.
Figure 2:
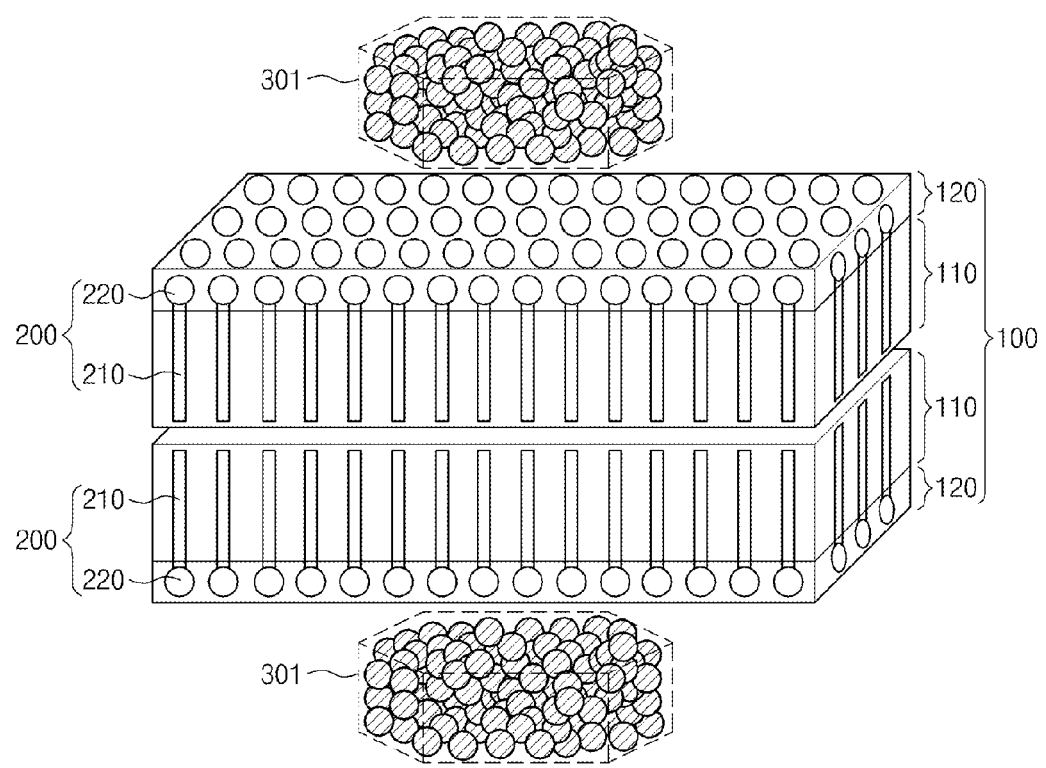
Figure 3:
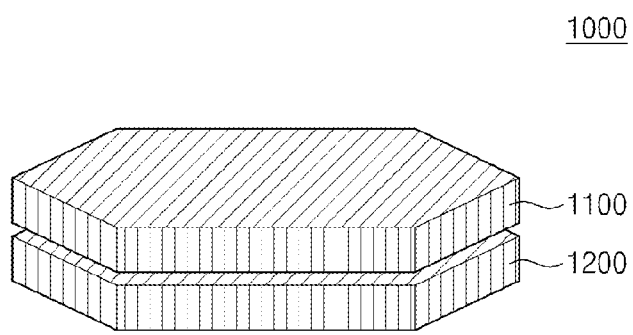

FIGS. 1 to 3 are mimetic diagrams illustrating the manufacturing process of a metal oxide according to an embodiment of the inventive concept.

Referring to FIG. 1, a metal precursor material and a basic material are dissolved in distilled water to prepare a preparation solution. For example, zinc nitrate hexadrate ($Zn(NO_3)_2 \cdot 6H_2O$) may be used as the precursor material, and hexamethylenetetramine (HMTA, $C_6H_{12}N_4$) may be used as the basic material. In an embodiment, 0.93 g of zinc nitrate hexadrate and 0.44 g of HMTA may be added into 250 mL of distilled water. The basic material may be dissolved in the distilled water and provide hydroxide ions ($OH^-$).

Amphiphilic molecules 200 may be added into the preparation solution and a metal precursor solution may be prepared. The metal precursor solution may include metal complex ions 300. The metal precursor solution may be an emulsion state or a suspension state. Each of the amphiphilic molecules 200 may include a hydrophobic functional group 210 and a hydrophilic functional group 220. The hydrophobic functional group 210 may be provided at one end of each amphiphilic molecule 200 as a tail shape. The hydrophilic functional group 220 may be provided at another end of each amphiphilic molecule 200 as a head shape. For example, polyethylene glycol tert-octylphenyl ether represented by the following Formula 1 may be used as the amphiphilic molecule. The hydrophilic functional groups 220 of the inventive concept may exhibit anionic properties. For example, the alcohol functional group of Formula 1 may exhibit a negative charge because of the unshared electron pair of oxygen. For example, the alkyl group and the aromatic group in Formula 1 may play the role of the hydrophobic functional group 210.

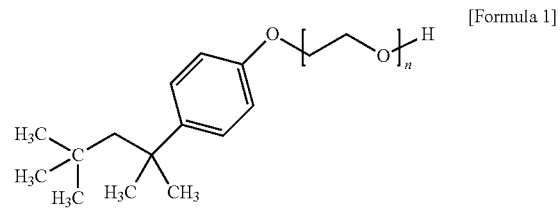

[Formula 1]

Wherein, n is an integer of 5 to 15, and preferably, may be 10. However, the present invention is not limited thereto.

The amphiphilic molecules 200 may form a lamella structure in the metal precursor solution and may play the role of a surfactant. The lamella structure 100 may mean a layer-shape or a plate-shape structure. The lamella structure 100 may include outer layers 120 and inner layers 110 disposed between the outer layers 120. The hydrophilic functional groups 220 may form the outer layers 120. The hydrophobic functional groups 210 may face to each other and may form the inner layers 110. However, the structure of the amphiphilic molecules 200 may not be limited to the lamellar structure but may form various micelle structures according to reaction conditions. For example, the micelle structure formed by the amphiphilic molecules 200 may be controlled by controlling the component ratio of the amphiphilic molecules 200 and the metal precursor material.

The metal complex ions 300 may be cations. For example, the metal complex ions 300 may be a zinc ammonium ion ($Zn(NH_3)_4^{2+}$). The metal complex ions 300 may be disposed adjacent to the hydrophilic functional groups 220 exhibiting anionic properties. On both sides of the lamella structure 100, for example, on the outer layers 120, the metal complex ions 300 may be disposed. Accordingly, the amphiphilic molecules 200 may play the role of a template of the metal complex ions 300. The shape and/or the size of the template may be controlled by controlling the kind and/or the concentration of the amphiphilic molecules 200.

Referring to FIG. 2, a first heat treatment may be performed with the metal precursor solution, and a metal oxide 301 may be formed. The metal oxide 301 may have a hexagonal system. In this case, the hydroxide ion (OH⁻) provided from the basic material may assist the metal oxide 301 so as to have the hexagonal system. The first heat treatment may be performed at about 90° C. for about 24 hours. Then, the metal oxide 301 may be washed and centrifuged, and residual material may be removed. After that, the metal oxide 301 may be dispersed in a solvent, for example, ethanol.

Referring to FIG. 3, a second heat treatment may be performed with the metal oxide (301 in FIG. 2), and a single crystalline metal oxide 1000 may be formed. The single crystalline metal oxide 1000 may have the shape of a pair of disks. For example, the single crystalline metal oxide 1000 may include a first disk 1100 and a second disk 1200 disposed with a distance from each other. Each of the first disk 1100 and the second disk 1200 may have a hexagonal system. The second disk 1200 may have the same or similar shape and size as the first disk 1100. The second disk 1200 may be overlapped with the first disk 1100 from the planar view. The single crystalline metal oxide 1000 may have the diameter of about 3 μm and the height of about 5 μm. The single crystalline metal oxide 1000 may be a single crystal having a (103) face. The second heat treatment may include an annealing process and a sintering process. For example, a metal oxide (301 in FIG. 2) may be coated on a substrate (not illustrated). The substrate (not illustrated) may include a transparent conductive oxide, for example, fluorine doped indium (FTO). The metal oxide (301 in FIG. 2) may be spin coated on the substrate (not illustrated) at a 3,000 rpm condition for 30 seconds. The substrate (not illustrated) coated with the metal oxide (301 in FIG. 2) may be secondly heat treated. The second heat treatment may be performed at a higher temperature than the first heat treatment. For example, the second heat treatment may be performed at about 350° C. to about 500° C. When the second heat treatment is performed at a temperature lower than 350° C., the single crystalline metal oxide 1000 may not be formed. When the heat treatment is performed at a temperature higher than 500° C., the single crystalline metal oxide 1000 may not have a desired shape or a desired crystalline structure. The amphiphilic molecules (200 in FIG. 2) having the lamella structure (100 in FIG. 2) may be removed during the second heat treatment process. Accordingly, a gap may be formed between the first disk 1100 and the second disk 1200.

When the single crystalline metal oxide 1000 is formed by a vapor deposition method (for example, a metal organic chemical vapor deposition (MOCVD) method or a VLS growing method), the formation of the single crystalline metal oxide 1000 in a large size may be inappropriate. According to the inventive concept, the single crystalline metal oxide 1000 may be manufactured as a solution state at a temperature condition lower than the vapor deposition method. Thus, the single crystalline metal oxide 1000 may be easily manufactured on a mass production basis.

Hereinafter a metal oxide film and a method of manufacturing the same according to an embodiment of the inventive concept will be described. The repeated contents as those explained in the above manufacturing embodiment of the metal oxide will be omitted.

Figure 4:
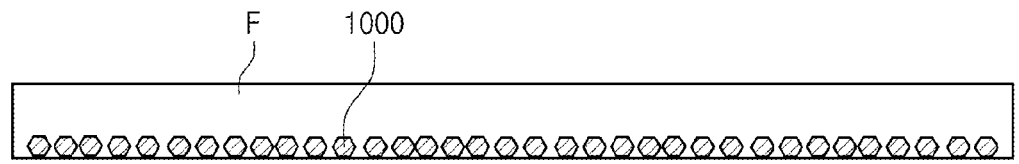
FIG. 4 is a cross-sectional view illustrating a metal oxide film according to an embodiment of the inventive concept.

FIG. 4 is a cross-sectional view illustrating a metal oxide film according to an embodiment of the inventive concept.

Referring to FIG. 4, a film F including the single crystalline metal oxides 1000 may be formed. The single crystalline metal oxide 1000 may include zinc oxide and have a hexagonal system. By growing the single crystalline metal oxides 1000 manufactured as an embodiment of FIGS. 1 to 3, a film may be manufactured. In an embodiment, the film F may be manufactured by an electrochemical deposition method. In this case, a preparation solution including the single crystalline metal oxides 1000 may be coated on a substrate (not illustrated). The preparation solution may be the same as or similar to that explained in the embodiment referring to FIG. 1. The substrate (not illustrated) coated with the preparation solution including the single crystalline metal oxides 1000 may be used as a working electrode. A counter electrode may be a platinum electrode. In this case, the single crystalline metal oxide 1000 may play the role of a seed. The electrochemical deposition of the film may be performed by the cyclic pulse condition of 20 s per 1 V and 20 s per 0 V. The substrate (not illustrated) may be a substrate of a solar cell. Alternatively, the substrate (not illustrated) may be removed after forming the film F. In another embodiment, microwaves may be applied to the preparation solution including the single crystalline metal oxides 1000. Accordingly, the single crystalline metal oxides 1000 in the preparation solution may grow and form a metal oxide film F. In this case, the metal oxide film F may be rapidly manufactured. According to the method of the inventive concept, the metal oxide film F may be easily produced in a large area.

Hereinafter a solar cell including the metal oxide film manufactured by the inventive concept will be explained. The repeated contents as that explained above will be omitted.

Figure 5:
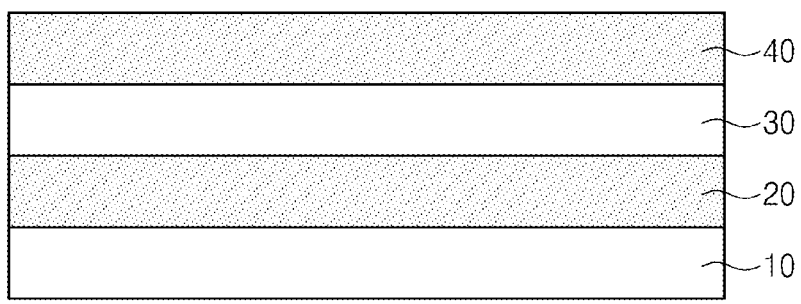
FIG. 5 is a cross-sectional view illustrating a solar cell according to an embodiment of the inventive concept.

FIG. 5 is a cross-sectional view illustrating a solar cell 1 according to an embodiment of the inventive concept.

Referring to FIG. 5 along with FIG. 4, a solar cell 1 may include a substrate 10, a first electrode 20, an electrolyte layer 30 and a second electrode 40.

The first substrate 10 may be one selected from various transparent substrates including a glass substrate. Alternatively, the first substrate 10 may be an opaque substrate. The first electrode 20 may include a conductive material, for example, a transparent and conductive oxide. The electrolyte layer 30 may be provided on the first electrode 20. The electrolyte layer 30 may have one phase selected from a liquid phase, a solid phase and a gel. According to the phase of the electrolyte layer 30, the forming order of the electrolyte layer 30 may be changed. The second electrode 40 may be formed on the electrolyte layer 30. The second electrode 40 may include a conductive material, for example, a transparent conductive material. One of the first electrode 20 and the second electrode 40 may be an anode, and the other may be a cathode.

At least one of the first electrode 20 and the second electrode 40 may include the metal oxide film F explained as the embodiment referring to FIG. 4 above. The metal oxide film F may include zinc oxide. In this case, the metal oxide may have an energy band gap of about 3.37 eV and an excitation binding energy of about 60 meV. Accordingly, the solar cell 1 may show high photoconductivity. The first electrode 20 and the second electrode 40 are stable to ultraviolet light and may not be damaged by the sunlight when applied in the solar cell 1.

The single crystalline metal oxide according to the inventive concept may be manufactured by using amphiphilic molecules. The single crystalline metal oxide may have a hexagonal shape. The type, concentration, and amount of the amphiphilic molecules may be adjusted to control the size and the shape of the single crystalline metal oxide. According to the inventive concept, the single crystalline metal oxide may be manufactured as a solution state at a temperature condition lower than the vapor deposition method. Thus, a film including the single crystalline metal oxide may be easily produced in a large area. The film including the single crystalline metal oxide may be used as an electrode for a solar cell. The solar cell including the single crystalline metal oxide may show high photoconductivity and stability.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a metal oxide crystal, the method comprising:
   mixing a metal precursor material, a basic material, amphiphilic molecules and distilled water to prepare a metal precursor solution;
   performing a first heat treatment with the metal precursor solution to form a metal oxide; and
   performing a second heat treatment with the metal oxide to form a pair of metal oxide disks having a single crystalline structure, wherein the pair of metal oxide disks include a first disk, and a second disk separated from the first disk in a perpendicular direction to the first disk,
   wherein the metal precursor solution comprises:
   a first inner layer formed by hydrophobic functional groups of the amphiphilic molecules;
   a first outer layer formed by hydrophilic functional groups of the amphiphilic molecules;
   a second inner layer formed by hydrophobic functional groups of the amphiphilic molecules, the second inner layer facing the first inner layer;
   a second outer layer formed by hydrophilic functional groups of the amphiphilic molecules, the first and second inner layers being disposed between the first and second outer layers;
   first metal complex ions on the first outer layer; and
   second metal complex ions on the second outer layer, the first and second outer layers being disposed between the first and second metal complex ions.

2. The method of manufacturing a metal oxide crystal of claim 1, wherein
   the amphiphilic molecules form a lamella structure.

3. The method of manufacturing a metal oxide crystal of claim 2, wherein the first and second outer layers exhibit anionic charge, and the first and second metal complex ions are cations.

4. The method of manufacturing a metal oxide crystal of claim 1, wherein the metal oxide includes zinc oxide, the forming of the metal oxide includes forming zinc oxide having a hexagonal system, and single crystalline zinc oxide has the hexagonal system.

5. The method of manufacturing a metal oxide crystal of claim 1, wherein the amphiphilic molecule is represented by following Formula 1:

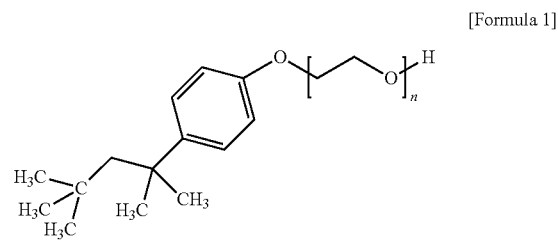

[Formula 1]

wherein, n is an integer of 5 to 15.

6. The method of manufacturing a metal oxide crystal of claim 1, wherein the metal precursor solution includes zinc nitrate hexadrate, and the basic material includes hexamethylenetetramine.

7. The method of manufacturing a metal oxide crystal of claim 1, wherein the second heat treatment is performed at from about 350° C. to about 500° C.

8. The method of manufacturing a metal oxide crystal of claim 1, wherein the first heat treatment is performed at about 90° C. for about 24 hours.

9. The method of manufacturing a metal oxide crystal of claim 1, wherein the second heat treatment is performed not lower than 350° C. and not higher than 500° C.

10. A method of fabricating an electrode for a solar cell, the method comprising:
    providing a preparation solution including a zinc precursor, a basic material and distilled water;
    adding amphiphilic molecules into the preparation solution to prepare a zinc precursor solution;
    performing heat treatment with the zinc precursor solution to form zinc oxide having a hexagonal system;
    sintering the zinc oxide to form a pair of single crystalline zinc oxide disks; and
    growing the pair of single crystalline zinc oxide disks to form a zinc oxide crystal film, wherein the pair of single crystalline zinc oxide disks include a first disk and a second disk separated from the first disk in a perpendicular direction to the first disk,
    wherein the zinc precursor solution comprises:
    a first inner layer formed by hydrophobic functional groups of the amphiphilic molecules;
    a first outer layer formed by hydrophilic functional groups of the amphiphilic molecules;
    a second inner layer formed by hydrophobic functional groups of the amphiphilic molecules, the second inner layer facing the first inner layer;
    a second outer layer formed by hydrophilic functional groups of the amphiphilic molecules, the first and second inner layers being disposed between the first and second outer layers;
    first zinc complex cations on the first outer layer; and
    second zinc complex cations on the second outer layer, the first and second outer layers being disposed between the first and second zinc complex cations.

11. The method of fabricating an electrode for a solar cell of claim 10, wherein the amphiphilic molecules form a lamella structure.

12. The method of fabricating an electrode for a solar cell of claim 10, wherein the amphiphilic molecules include polyethylene glycol tert-octylphenyl ether.

13. The method of fabricating an electrode for a solar cell of claim 10, wherein the second disk has a size and a shape same as or similar to those of the first disk, and the second disk is overlapped with the first disk from a planar view.

14. The method of fabricating an electrode for a solar cell of claim 10, wherein the metal precursor solution includes zinc nitrate hexadrate, and the basic material includes hexamethylenetetramine.

15. The method of manufacturing a metal oxide crystal of claim 10, wherein the heat treatment is performed at about 90° C. for about 24 hours.

* * * * *